(12) United States Patent
Shen

(10) Patent No.: US 11,531,425 B1
(45) Date of Patent: Dec. 20, 2022

(54) INTER-BAND HARMONICS INTERFERENCE MITIGATION FOR MULTI-FREQUENCY-REGION PARALLEL SCAN

(71) Applicant: Synaptics Incorporated, San Jose, CA (US)

(72) Inventor: Guozhong Shen, San Jose, CA (US)

(73) Assignee: Synaptics Incorporated, San Jose, CA (US)

( * ) Notice: Subject to any disclaimer, the term of this patent is extended or adjusted under 35 U.S.C. 154(b) by 0 days.

(21) Appl. No.: 17/564,159

(22) Filed: Dec. 28, 2021

Related U.S. Application Data

(63) Continuation-in-part of application No. 17/518,307, filed on Nov. 3, 2021.

(51) Int. Cl.
*G06F 3/041* (2006.01)
*H03M 1/06* (2006.01)
*G06F 3/044* (2006.01)

(52) U.S. Cl.
CPC ...... *G06F 3/041661* (2019.05); *G06F 3/0418* (2013.01); *H03M 1/0614* (2013.01); *G06F 3/044* (2013.01)

(58) Field of Classification Search
CPC ..... G06F 3/0418; G06F 3/044; H03M 1/0614
See application file for complete search history.

(56) References Cited

U.S. PATENT DOCUMENTS

| | | | | |
|---|---|---|---|---|
| 8,493,331 B2* | 7/2013 | Krah | ..................... | G06F 3/0416 345/173 |
| 9,013,429 B1* | 4/2015 | Krekhovetskyy | ..... | G06F 3/0442 345/173 |
| 2010/0328239 A1* | 12/2010 | Harada | ............... | G06F 3/04184 345/173 |
| 2017/0090609 A1* | 3/2017 | Petrovic | .................. | G06F 3/044 |

* cited by examiner

*Primary Examiner* — Robin J Mishler
(74) *Attorney, Agent, or Firm* — Ferguson Braswell Fraser Kubasta PC

(57) ABSTRACT

A method for operating an input device, the method involving obtaining a number of non-sinusoidal transmitter signals with unique base frequencies, and selecting a sampling frequency of an analog-to-digital converter (ADC) such that a number of aliasing artifacts associated with higher harmonics of the non-sinusoidal transmitter signals is located at frequencies different from the base frequencies.

20 Claims, 7 Drawing Sheets

INTER-BAND HARMONICS INTERFERENCE MITIGATION FOR MULTI-FREQUENCY-REGION PARALLEL SCAN

CROSS-REFERENCE TO RELATED APPLICATIONS

This application is a continuation-in-part of and claims benefit to U.S. patent application Ser. No. 17/518,307 filed on Nov. 3, 2021, the entire disclosure of which is hereby expressly incorporated by reference herein.

TECHNICAL FIELD

The described embodiments relate generally to electronic devices, and more specifically, to touch sensors.

BACKGROUND

Input devices including touch sensor devices (e.g., touchpads or touch sensor devices) are widely used in a variety of electronic systems. A touch sensor device typically includes a sensing region, often demarked by a surface, in which the touch sensor device determines the presence, location and/or motion of one or more input objects. Touch sensor devices may be used to provide interfaces for the electronic systems. A touch sensor device may include a number of sensor electrodes. Depending on the types of transmitter signals and the driving scheme used to drive the sensor electrodes, a sensing operation performed with one transmitter signal may interfere with a sensing operation performed with another transmitter signal, when operating the touch sensor device.

SUMMARY

In general, in one aspect, one or more embodiments relate to a method for operating an input device. The method comprising: obtaining a plurality of non-sinusoidal transmitter signals with unique base frequencies; and selecting a sampling frequency of an analog-to-digital converter (ADC) such that: a plurality of aliasing artifacts associated with higher harmonics of the non-sinusoidal transmitter signals is located at frequencies different from the base frequencies.

In general, in one aspect, one or more embodiments relate to an input device. The input device comprising: a plurality of transmitter electrodes disposed in a sensing region of the input device; a receiver electrode in the sensing region; and a processing system. The processing system comprising: an analog-to-digital converter (ADC) operating at a sampling frequency, wherein the processing system is configured to: simultaneously drive at least a subset of the plurality of transmitter electrodes using a plurality of non-sinusoidal transmitter signals with unique base frequencies; receive, on the receiver electrode, a resulting signal; and analog-to-digital convert the resulting signal, causing a plurality of aliasing artifacts associated with higher harmonics of the plurality of non-sinusoidal transmitter signals, wherein the sampling frequency of the ADC is selected to locate the plurality of aliasing artifacts at frequencies different from the base frequencies.

In general, in one aspect, one or more embodiments relate to a processing system for an input device. The processing system comprising: an analog-to-digital converter (ADC) operating at a sampling frequency, wherein the processing system is configured to: simultaneously drive at least a subset of a plurality of transmitter electrodes using a plurality of non-sinusoidal transmitter signals with unique base frequencies, wherein the plurality of transmitter electrodes is disposed in a sensing region of the input device; receive, on the receiver electrode, a resulting signal; and analog-to-digital convert the resulting signal, causing a plurality of aliasing artifacts associated with higher harmonics of the plurality of non-sinusoidal transmitter signals, wherein the sampling frequency of the ADC is selected to locate the plurality of aliasing artifacts at frequencies different from the base frequencies.

Other aspects of the embodiments will be apparent from the following description and the appended claims.

DETAILED DESCRIPTION

The following detailed description is exemplary in nature and is not intended to limit the invention or the application and uses of the invention. Furthermore, there is no intention to be bound by any expressed or implied theory presented in the preceding technical field, background, brief summary, brief description of drawings, or the following detailed description.

Throughout the application, ordinal numbers (e.g., first, second, third, etc.) may be used as an adjective for an element (i.e., any noun in the application). With the exception of the four consecutive quarter cycles, the use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

Various embodiments provide input devices and methods that facilitate improved usability along with various other benefits. Embodiments of the disclosure may be used to provide high frame rates for touch sensing, even for larger sensing regions. Embodiments of the disclosure simultaneously drive multiple sensing electrodes in the sensing region using transmitter signals with different frequencies. The simultaneous driving of multiple sensing electrodes can be performed in a shorter time interval than a sequential driving of the same number of sensing electrodes. Accordingly, a higher number of sensing operations may be performed during a fixed time interval. Thus, a touch sensing may be performed for larger sensing regions, without an undesirable or unacceptable reduction of the frame rate used for the sensing. Similarly, frame rates may be increased for smaller sensing regions when using the simultaneous driving of multiple sensing electrodes. In one or more embodiments, non-sinusoidal transmitter signals are used for the simultaneous driving of the sensing electrodes. The use of non-sinusoidal transmitter signals has various advantages but may result in the emission of higher harmonics. One or more embodiments mitigate interference that could result from the presence of the higher harmonics. A detailed description is subsequently provided.

Figure 1:
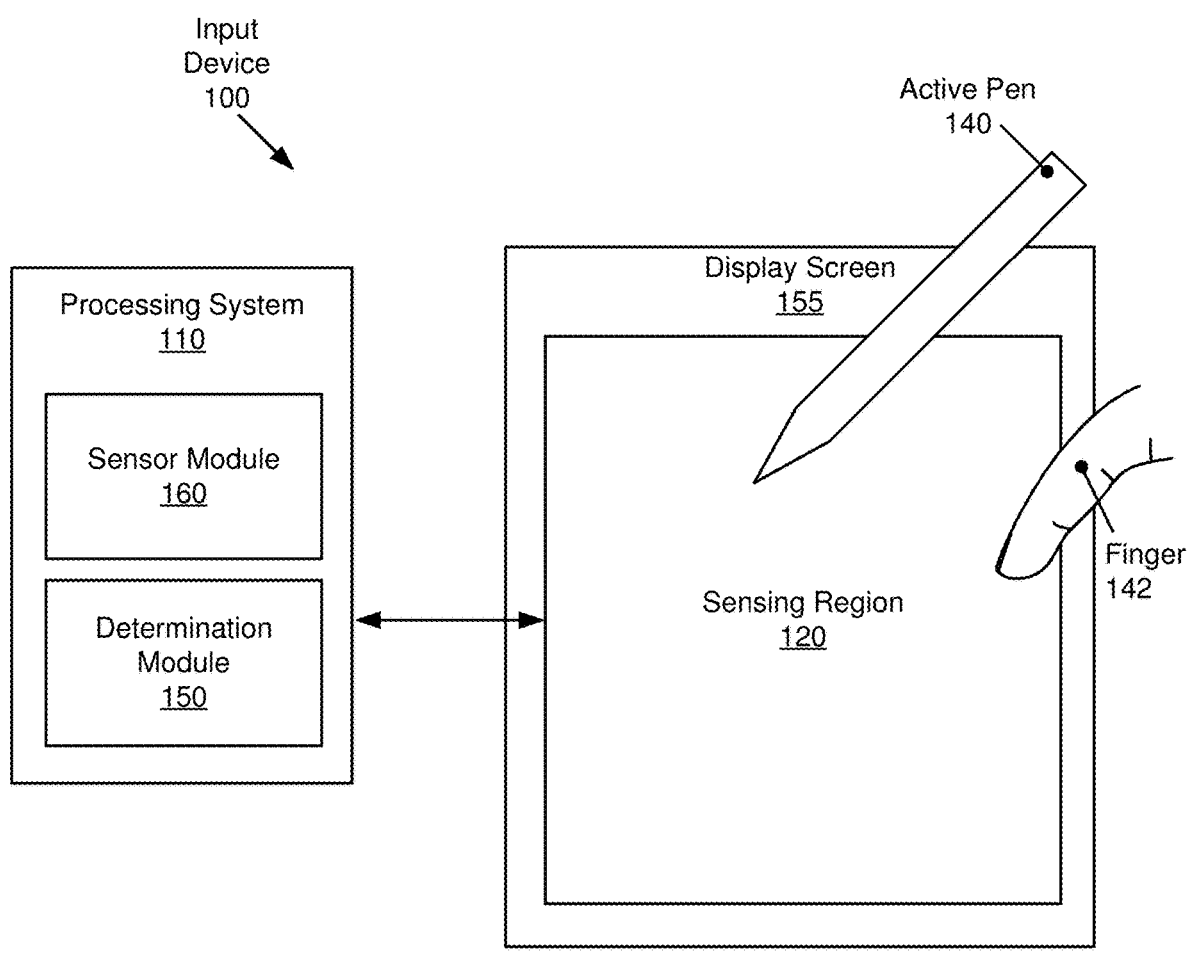
FIG. 1 shows a block diagram of an input device, in accordance with one or more embodiments.

FIG. 1 is a block diagram of an exemplary input device (100), in accordance with embodiments. The input device (100) may be configured to provide input to an electronic system (not shown). As used in this document, the term "electronic system" (or "electronic device") broadly refers to any system capable of electronically processing information. Some non-limiting examples of electronic systems include personal computers, such as desktop computers, laptop computers, netbook computers, tablets, web browsers, e-book readers, and personal digital assistants (PDAs). Additional example electronic systems include composite input devices, such as physical keyboards that include input device (100) and separate joysticks or key switches. Further example electronic systems include peripherals, such as data input devices (including remote controls and mice), and data output devices (including display screens and printers). Other examples include remote terminals, kiosks, and video game machines (e.g., video game consoles, portable gaming devices, and the like). Other examples include communication devices (including cellular phones, such as smart phones), and media devices (including recorders, editors, and players such as televisions, set-top boxes, music players, digital photo frames, and digital cameras). Additionally, the electronic system could be a host or a slave to the input device.

In FIG. 1, the input device (100) is shown as a touch sensor device (e.g., "touchpad" or a "touch sensor device") configured to sense input provided by one or more input objects in a sensing region (120). Example input objects include styli, an active pen (140), and fingers (142). Further, which particular input objects are in the sensing region may change over the course of one or more gestures. For example, a first input object may be in the sensing region to perform the first gesture, subsequently, the first input object and a second input object may be in the above surface sensing region, and, finally, a third input object may perform the second gesture. To avoid unnecessarily complicating the description, the singular form of input object is used and refers to all of the above variations.

The sensing region (120) encompasses any space above, around, in and/or near the input device (100) in which the input device (100) is able to detect user input (e.g., user input provided by one or more input objects). The sizes, shapes, and locations of particular sensing regions may vary widely from embodiment to embodiment.

The input device (100) may use any combination of sensor components and sensing technologies to detect user input in the sensing region (120). The input device (100) includes one or more sensing elements for detecting user input. The sensing elements may be capacitive.

In some capacitive implementations of the input device (100), voltage or current is applied to create an electric field. Nearby input objects cause changes in the electric field and produce detectable changes in capacitive coupling that may be detected as changes in voltage, current, or the like.

Some capacitive implementations utilize arrays or other regular or irregular patterns of capacitance sensing elements to create electric fields. In some capacitive implementations, separate sensing elements may be ohmically shorted together to form larger sensor electrodes. Some capacitive implementations utilize resistive sheets, which may be uniformly resistive.

Some capacitive implementations utilize "self capacitance" (or "absolute capacitance") sensing methods based on changes in the capacitive coupling between sensor electrodes and an input object. In various embodiments, an input object near the sensor electrodes alters the electric field near the sensor electrodes, thus changing the measured capacitive coupling. In one implementation, an absolute capacitance sensing method operates by modulating sensor electrodes with respect to a reference voltage (e.g., system ground), and by detecting the capacitive coupling between the sensor electrodes and input objects. The reference voltage may by a substantially constant voltage or a varying voltage and in various embodiments; the reference voltage may be system ground. Measurements acquired using absolute capacitance sensing methods may be referred to as absolute capacitive measurements.

Some capacitive implementations utilize "mutual capacitance" (or "trans capacitance") sensing methods based on changes in the capacitive coupling between sensor electrodes. In various embodiments, an input object near the sensor electrodes alters the electric field between the sensor electrodes, thus changing the measured capacitive coupling. In one implementation, a mutual capacitance sensing method operates by detecting the capacitive coupling between one or more transmitter sensor electrodes (also "transmitter electrodes" or "transmitter") and one or more receiver sensor electrodes (also "receiver electrodes" or "receiver"). Transmitter sensor electrodes may be modulated relative to a reference voltage (e.g., system ground) to transmit transmitter signals. Receiver sensor electrodes may be held substantially constant relative to the reference voltage to facilitate receipt of resulting signals. The reference voltage may be a substantially constant voltage and in various embodiments; the reference voltage may be system ground.

In some embodiments, transmitter sensor electrodes and receiver sensor electrodes may both be modulated. The transmitter electrodes may be modulated relative to the receiver electrodes to transmit transmitter signals and to facilitate receipt of resulting signals. A resulting signal may include effect(s) corresponding to one or more transmitter signals, and/or to one or more sources of environmental interference (e.g., other electromagnetic signals). The effect(s) may be the transmitter signal, a change in the transmitter signal caused by one or more input objects and/or environmental interference, or other such effects. Sensor electrodes may be dedicated transmitters or receivers or may be configured to both transmit and receive. Measurements acquired using mutual capacitance sensing methods may be referred to as mutual capacitance measurements.

In FIG. 1, a processing system (110) is shown as part of the input device (100). The processing system (110) is configured to operate the hardware of the input device (100) to detect input in the sensing region (120). The processing system (110) includes parts of or all of one or more integrated circuits (ICs) and/or other circuitry components. For example, a processing system (110) for a mutual capacitance sensor device may include transmitter circuitry configured to transmit signals with transmitter sensor electrodes, and/or receiver circuitry configured to receive signals with receiver sensor electrodes. Further, a processing system (110) for an absolute capacitance sensor device may include driver circuitry configured to drive absolute capacitance signals onto sensor electrodes, and/or receiver circuitry configured to receive signals with those sensor electrodes. In one or more embodiments, a processing system (110) for a combined mutual and absolute capacitance sensor device may include any combination of the above described mutual and absolute capacitance circuitry. A processing system (110) may further include receiver circuitry configured to receive signals emitted by a different source, e.g., an active pen (140). The signals by the active pen (140) may be received by the receiver sensor electrodes, while transmit signals are not necessarily emitted by transmitter sensor electrodes.

In some embodiments, the processing system (110) also includes electronically-readable instructions, such as firmware code, software code, and/or the like. In some embodiments, components composing the processing system (110) are located together, such as near sensing element(s) of the input device (100). In other embodiments, components of processing system (110) are physically separate with one or more components close to the sensing element(s) of the input device (100), and one or more components elsewhere. For example, the input device (100) may be a peripheral coupled to a computing device, and the processing system (110) may include software configured to run on a central processing unit of the computing device and one or more ICs (perhaps with associated firmware) separate from the central processing unit. As another example, the input device (100) may be physically integrated in a mobile device, and the processing system (110) may include circuits and firmware that are part of a main processor of the mobile device. In some embodiments, the processing system (110) is dedicated to implementing the input device (100). In other embodiments, the processing system (110) also performs other functions, such as operating display screens (155), driving haptic actuators, etc.

The processing system (110) may be implemented as a set of modules that handle different functions of the processing system (110). Each module may include circuitry that is a part of the processing system (110), firmware, software, or a combination thereof. In various embodiments, different combinations of modules may be used. For example, as shown in FIG. 1, the processing system (110) may include a determination module (150) and a sensor module (160). The determination module (150) may include functionality to determine when at least one input object is in a sensing region, signal to noise ratio, positional information of an input object, a gesture, an action to perform based on the gesture, a combination of gestures or other information, and/or other operations.

The sensor module (160) may include functionality to drive the sensing elements to transmit transmitter signals and receive the resulting signals. For example, the sensor module (160) may include sensory circuitry that is coupled to the sensing elements. The sensor module (160) may include, for example, a transmitter module and a receiver module. The transmitter module may include transmitter circuitry that is coupled to a transmitting portion of the sensing elements. The receiver module may include receiver circuitry coupled to a receiving portion of the sensing elements and may include functionality to receive the resulting signals. The receiver module of the sensor module (160) may receive resulting signals from sensor electrodes in the electrode pattern using a capacitive sensing signal having a sensing frequency, e.g., generated by the transmitter module. The resulting signals may include desired signals, such as active pen data or signal components caused by an input object being in proximity to the electrode pattern, or undesired signals, such as noise or interference. As will be described in greater detail below, the sensor module (160) may perform one or more demodulation operations on the resulting signal.

Although FIG. 1 shows a determination module (150) and a sensor module (160), alternative or additional modules may exist in accordance with one or more embodiments. Such alternative or additional modules may correspond to distinct modules or sub-modules than one or more of the modules discussed above. Example alternative or additional modules include hardware operation modules for operating hardware such as sensor electrodes and display screens (155), data processing modules for processing data such as sensor signals and positional information, reporting modules for reporting information, and identification modules configured to identify gestures, such as mode changing gestures, and mode changing modules for changing operation modes. Further, the various modules may be combined in separate integrated circuits. For example, a first module may be comprised at least partially within a first integrated circuit and a separate module may be comprised at least partially within a second integrated circuit. Further, portions of a single module may span multiple integrated circuits. In some embodiments, the processing system as a whole may perform the operations of the various modules.

In some embodiments, the processing system (110) responds to user input (or lack of user input) in the sensing region (120) directly by causing one or more actions. Example actions include changing operation modes, as well as graphical user interface (GUI) actions such as cursor movement, selection, menu navigation, and other functions. In some embodiments, the processing system (110) provides information about the input (or lack of input) to some part of the electronic system (e.g., to a central processing system of the electronic system that is separate from the processing system (110), if such a separate central processing system exists). In some embodiments, some part of the electronic system processes information received from the processing system (110) to act on user input, such as to facilitate a full range of actions, including mode changing actions and GUI actions.

In some embodiments, the input device (100) includes a touch screen interface, and the sensing region (120) overlaps at least part of an active area of a display screen (155). For example, the input device (100) may include substantially transparent sensor electrodes overlaying the display screen and provide a touch screen interface for the associated electronic system. The display screen may be any type of dynamic display capable of displaying a visual interface to a user and may include any type of light emitting diode (LED), organic LED (OLED), cathode ray tube (CRT), liquid crystal display (LCD), plasma, electroluminescence (EL), or other display technology. The input device (100) and the display screen (155) may share physical elements. For example, some embodiments may utilize some of the same electrical components for displaying and sensing. In various embodiments, one or more display electrodes of a display device may be configured for both display updating and input sensing. As another example, the display screen (155) may be operated in part or in total by the processing system (110).

While FIG. 1 shows a configuration of components, other configurations may be used without departing from the scope of the disclosure. For example, various components may be combined to create a single component. As another example, the functionality performed by a single component may be performed by two or more components. Further, while a configuration for touch sensing is described, other variables such as force may be sensed.

Figure 2A:
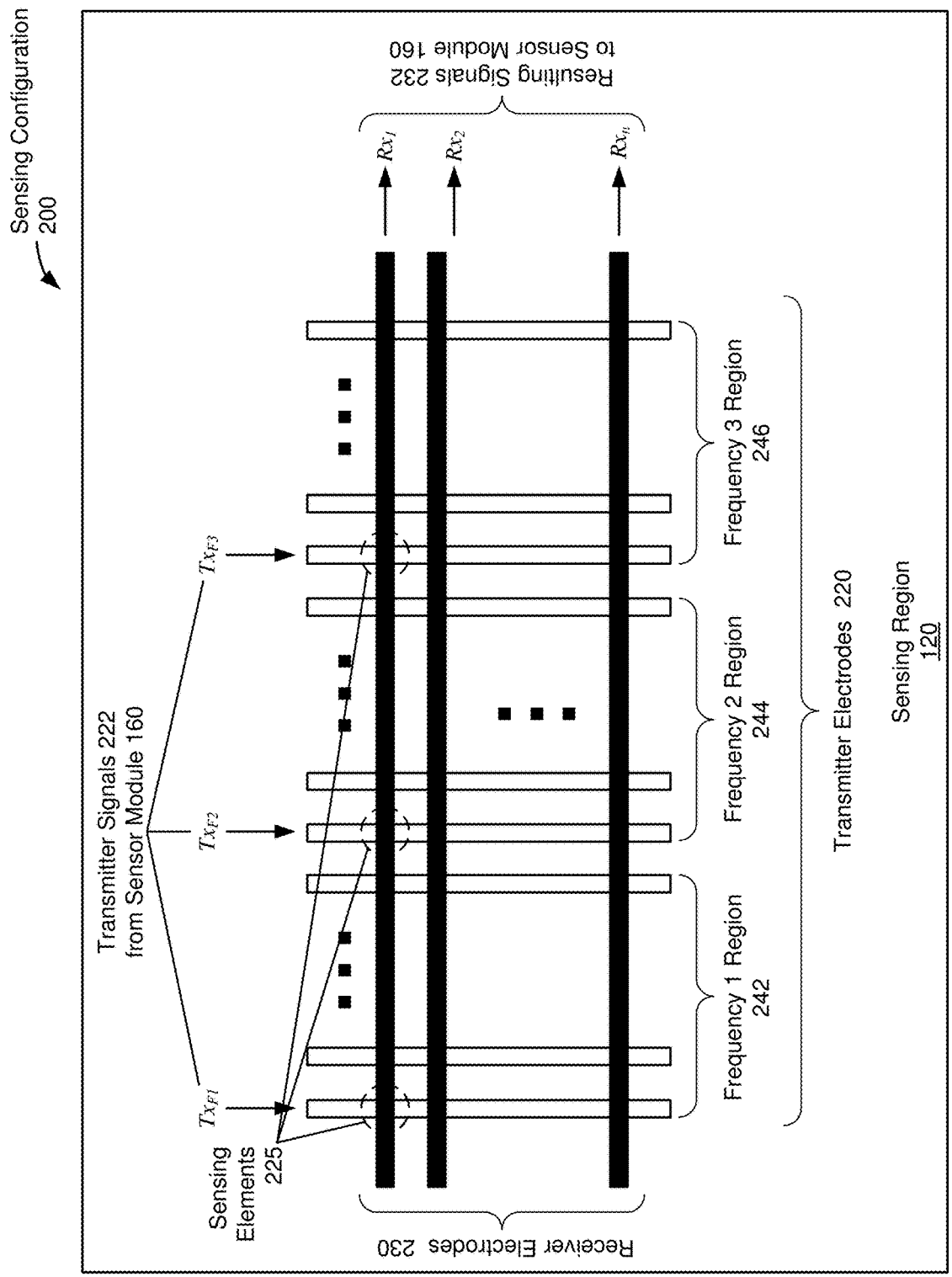
FIG. 2A shows a sensing configuration, in accordance with one or more embodiments.

FIG. 2A shows a sensing configuration (200), in accordance with one or more embodiments. The sensing configuration (200) is based on an arrangement of sensor electrodes in a sensing region (120). Transmitter (Tx) electrodes (220) and receiver (Rx) electrodes (230) may be disposed in the sensing region (120). In the example of FIG. 2A, the Tx electrodes (220) are elongated rectangular structures arranged in columns, whereas the Rx electrodes (230) are elongated rectangular structures arranged in rows. Generally, Tx and Rx electrodes of any shape may be used.

In one or more embodiments, the Tx electrodes (220) and the Rx electrodes (230), together, implement mutual capacitance or transcapacitance sensing. At the intersection of a Tx (220) and an Rx (230) electrode, a localized capacitive coupling is formed between a portion of the Tx electrode (220) and the Rx electrode (230). The region of this localized capacitive coupling may be termed a "capacitive pixel," or also referred to herein as the sensing element (225). A transcapacitance Ct is associated with the sensing element (225). When an input object (not shown) approaches the sensing element (225), the transcapacitance Ct may change by an amount ΔCt. A presence or absence of the input object may thus be detected by monitoring ΔCt. ΔCt may be measured by driving a transmitter signal (222) onto the Tx electrode (220) and receiving a resulting signal (232) from the Rx electrode (230). The resulting signal is a function of the transmitter signal and ΔCt due to the presence or absence of an input object. A ΔCt may be obtained for multiple sensing elements to generate a capacitive image, e.g., spanning the entire sensing region (120).

In one or more embodiments, multiple Tx electrodes (220) are simultaneously driven. In the example of FIG. 2A, when three Tx electrodes are simultaneously driven with the transmitter signals $Tx_{F1}$, $Tx_{F2}$, and $Tx_{F3}$ (222), the resulting signal (232) on each of the Rx electrodes $Rx_1 \ldots Rx_n$ (230) would be affected by $Tx_{F1}$, $Tx_{F2}$, and $Tx_{F3}$. Each of the resulting signals (232), thus, may carry information about a presence or absence of an input object in proximity to three sensing elements (225).

Figure 3:
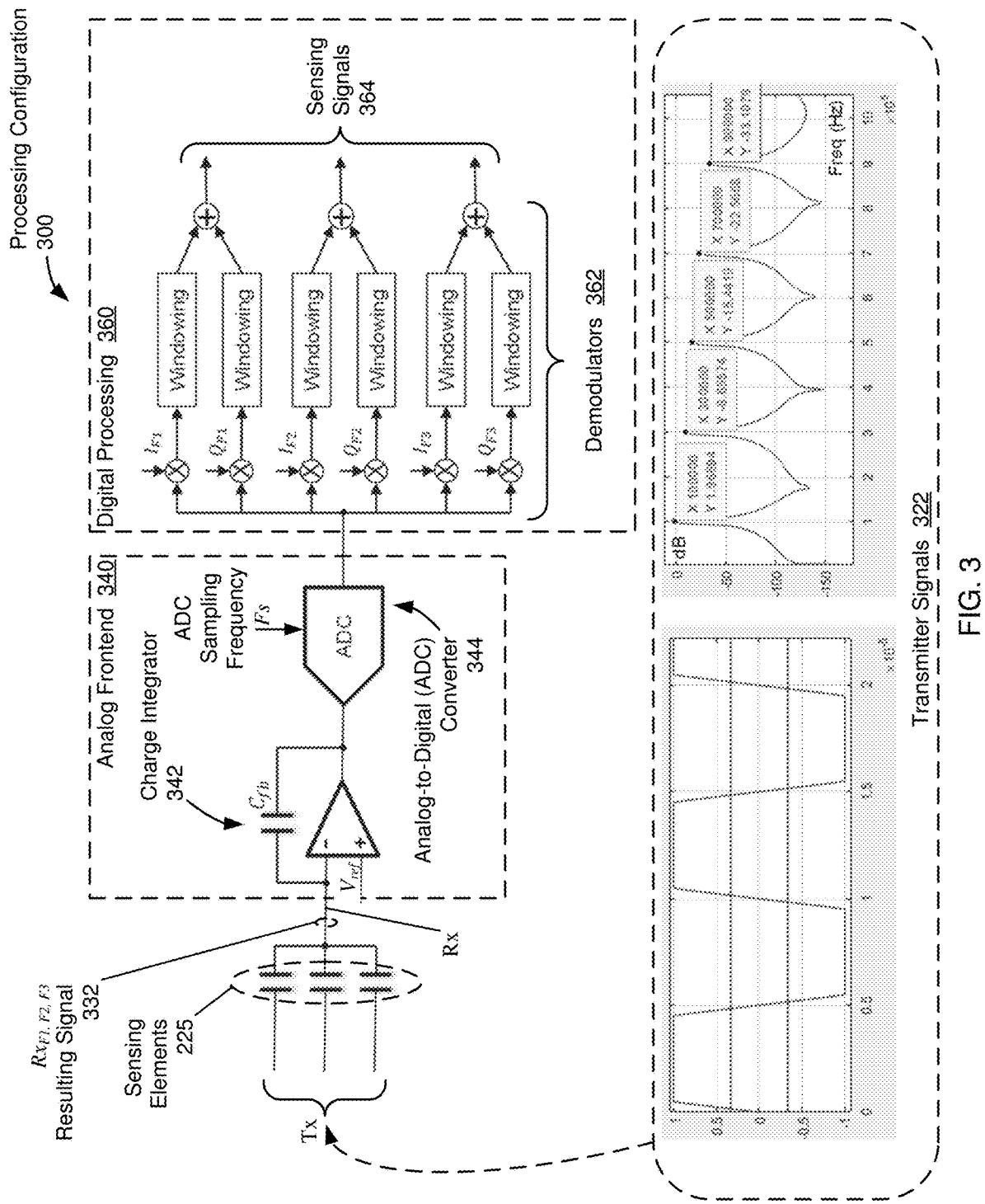
FIG. 3 shows a processing configuration, in accordance with one or more embodiments.

As described in reference to FIG. 3, a demodulation may be performed such that a sensing signal is obtained, separately for each of the three sensing elements (225). The described operations may be performed for each of the resulting signals (232) on the Rx electrodes $Rx_1 \ldots Rx_n$ (230). To obtain a complete capacitive image, the operations may then be repeated for another set of three Tx electrodes, using the same $Tx_{F1}$, $Tx_{F2}$, and $Tx_{F3}$. The repetitions may be continued until all of the Tx electrodes (220) have been driven. For the purpose of driving the Tx electrodes (220), the Tx electrodes may be grouped by frequency regions. Based on the use of three frequencies for the simultaneous driving in the example of FIG. 2A, the sensing configuration (200) includes three frequency regions (242, 244, and 246).

Each of the three frequency regions (242, 244, 246) includes an identical or near identical number of Tx electrodes. For example, if the sensing configuration (200) includes 60 Tx electrodes, each of the frequency regions (242, 244, 246) may contain 20 Tx electrodes. One Tx electrode from each group may be selected for the simultaneous driving. For example, as shown in FIG. 2A, the leftmost Tx electrode in each of the frequency regions (242, 244, 246) is selected for the simultaneous driving. Next, the immediately adjacent Tx electrodes in each of the frequency regions (242, 244, 246) may be selected for the simultaneous driving. A complete capacitive image may be obtained once all Tx electrodes (220) in all three frequency regions (242, 244, 246) have been driven once, and the corresponding resulting signals (232) have been received on the Rx electrodes (230).

In one or more embodiments, multiple Tx electrodes (220) are simultaneously driven. In the example of FIG. 2A, assume that multiple Tx electrodes in frequency 1 region (242) are simultaneously driven with multiple Tx electrodes in frequency 2 region (244) and with multiple Tx electrodes in frequency 3 region (246). The simultaneously driven Tx electrodes in the frequency 1 region (242) may be driven with transmitter signals having a first frequency, the simultaneously driven Tx electrodes in the frequency 2 region (244) may be driven with a transmitter signal having a second frequency, and the simultaneously driven Tx electrodes in the frequency 3 region (246) may be driven with a transmitter signal having a third frequency. If the frequencies of the transmitter signals are selected to satisfy certain orthogonality principles (discussed below in reference to FIG. 3), then a signal processing may be performed separately for the different frequency regions with no or minimal interference. To enable a localization of a touch at a particular sensing element (225), a repeated driving may be performed using bursts of the transmitter signals (222), as described in the following example. In the example, assume that there are 20 Tx electrodes (220) per frequency region (242, 244, 246), i.e., a total of 60 Tx electrodes assuming three frequency regions. Accordingly, in the example, there are 20 sensing elements (225) per Rx electrode intersecting with the 20 Tx electrodes, per frequency region. In order to be able to evaluate the presence or absence of touch at each of the 20 sensing elements (225), the 20 Tx electrodes may be simultaneously driven 20 times in sequence, using a burst pattern of 20 sequential bursts that allows for a unique solution of a system of equations with 20 unknowns. While the frequency of the transmitter signals used within a sensing region may be the same for the entire burst pattern, the phase of the transmitter signals may be varied across subsequent bursts and across the Tx electrodes being driven, within the burst pattern. By processing the resulting signal (232) obtained on a single Rx electrode in response to the 20 bursts on all 20 TX electrodes, a ΔCt may be determined for each of the sensing elements. The same operations may be simultaneously performed for all resulting signals (232) on all Rx electrodes (230). The same operations may further be simultaneously performed in the other frequency regions. Accordingly, in the example with three frequency regions, a total of 60 Tx electrodes may be simultaneously driven, each with a sequence of 20 bursts of a transmitter signal.

In the example of FIG. 2A, the simultaneous driving of the Tx electrodes (220) can reduce the time required for acquiring a complete capacitive image by a factor of three, assuming that no other parameters are adjusted. To illustrate, assuming the required frame rate is 240 fps for a 17" touch screen having 60 Tx electrodes, the time available for driving the Tx electrodes with a burst of the transmitter signal would be limited to $1/(240 \times 60) = 70$ µs, which may result in poor noise immunity. In contrast, when simultaneously driving sets of Tx electrodes across the three frequency regions, the time available for driving the Tx electrodes would be $1/(240 \times 20) = 210$ µs per burst, which may provide superior noise immunity without reducing the frame rate. The same may be true when operating smaller touch screens at even higher frame rates, e.g., 480 fps or 600 fps.

Figure 2B:
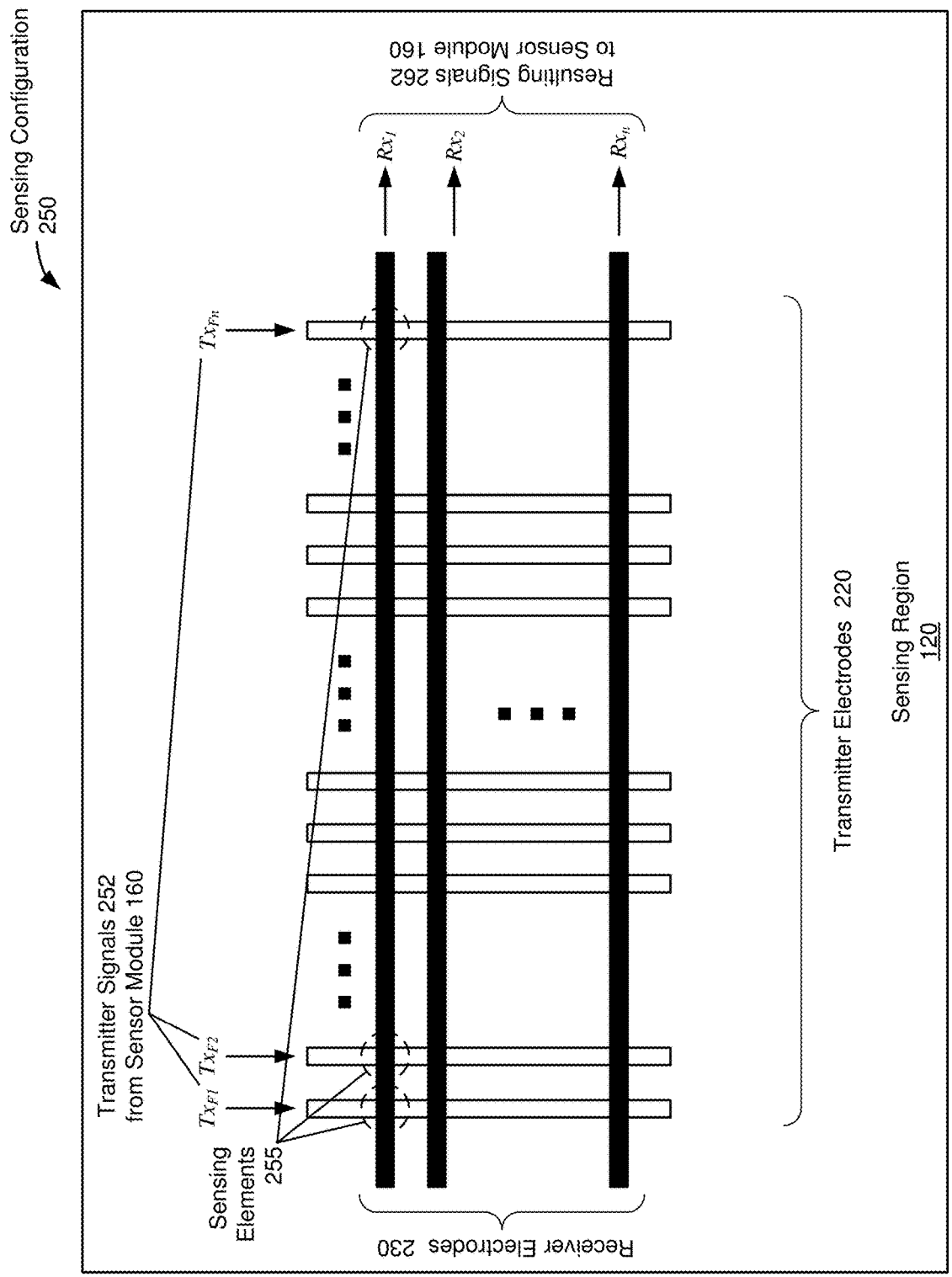
FIG. 2B shows a sensing configuration, in accordance with one or more embodiments.

FIG. 2B shows a sensing configuration (250), in accordance with one or more embodiments. The physical configuration of the sensing configuration, including the arrangement of the Tx electrodes (220) and the Rx electrodes (230) may be as described in reference to FIG. 2A.

In one or more embodiments, multiple Tx electrodes (220) are simultaneously driven. In the example of FIG. 2B, n Tx electrodes are simultaneously driven with the transmitter signals $Tx_{F1} \ldots Tx_{Fn}$, (252). The n Tx electrodes may include a subset of all Tx electrodes in the sensing region (120) or all of the Tx electrodes in the sensing region. Accordingly, the resulting signal (262) on each of the Rx electrodes $Rx_1 \ldots Rx_n$ (230) would be affected by $Tx_{F1} \ldots Tx_{Fn}$. Each of the resulting signals (262), thus, may carry information about a presence or absence of an input object in proximity to the sensing elements (255). To ensure that a touch localization can be performed for each of the n sensing elements (255), $Tx_{F1} \ldots Tx_{Fn}$, (252) may be selected to be orthogonal to one another. The described operations may be performed for each of the resulting signals (262) on the Rx electrodes $Rx_1 \ldots Rx_n$ (230).

As previously described in reference to FIG. 2A, in the example of FIG. 2B, the simultaneous driving of the Tx electrodes (220) can reduce the time required for acquiring a complete capacitive image. The degree of reduction may depend on various factors, e.g., how many Tx electrodes are simultaneously driven, the burst pattern that is used for driving the Tx electrodes, etc.

While FIG. 2A and FIG. 2B shows particular sensing configurations, and the example describes a specific touch screen scenario, embodiments of the disclosure may be used in conjunction with many different configurations. For example, embodiments of the disclosure may use different types of electrode arrangements, may simultaneously drive fewer or more Tx electrodes, may be for a larger or smaller sensing region, etc.

FIG. 3 shows a processing configuration (300), in accordance with one or more embodiments. The processing configuration (300) may be used in conjunction with the sensing configuration (200) of FIG. 2A. A modified processing configuration (with additional demodulators) may be used in conjunction with the sensing configuration (250) of FIG. 2B. Specifically, in the example shown in FIG. 3, transmitter signals (322) with three different frequencies are simultaneously emitted to drive the Tx electrodes (220) (e.g., as shown in FIG. 2A). The nature of the transmitter signals (322) is discussed below. FIG. 3 shows the processing of the resulting signal (332) obtained on one of the Rx electrodes (230). In order to process multiple resulting signals on multiple Rx electrodes, the processing configuration (300) may be implemented multiple times to operate in parallel. For example, for n Rx electrodes, the components shown in FIG. 3 may be implemented n times.

The processing configuration (300) includes an analog frontend (340) and a digital processing block (360). The analog frontend (340) may include a charge integrator (342) and an analog-to-digital converter (ADC) (344). The digital processing block (360) may include operations that implement a set of demodulators (362). In the example shown, the digitally implemented set of demodulators (362) demodulates the resulting signal (332) obtained by the analog frontend (340) to generate the sensing signals (364). The sensing signals (364) may provide a measure for the transcapacitance at the three sensing elements (225) and may thus be indicative of the presence or absence of an input object (not shown). Additional downstream operations may be performed on the sensing signals (364) to perform a touch sensing. A detailed description is subsequently provided.

Each of the simultaneously driven transmitter electrodes is driven by a non-sinusoidal transmitter signal (322) with one unique frequency (e.g., using trapezoidal or square waveforms with unique base frequencies). In one or more embodiments, the non-sinusoidal transmitter signals (322) used for the simultaneous driving are orthogonal. Referring to FIG. 2A, bursts of the non-sinusoidal transmitter signals may be used to simultaneously drive the Tx electrodes (220) in the sensing region (120). A first of the three frequencies may be used to drive Tx electrodes in the frequency 1 region (242), a second of the three frequencies may be used to drive Tx electrodes in the frequency 2 region (244), and a third of the three frequencies may be used to drive Tx electrodes in the frequency 3 region (246). While only one frequency may be used within a frequency region, the phase of the non-sinusoidal transmitter signals within the frequency region may be varied between electrodes and/or between subsequent bursts of the non-sinusoidal transmitter signal. In one embodiment, the phase is altered by 180° to use the non-sinusoidal transmitter signal and an inverted non-sinusoidal transmitter signal for the driving of the Tx electrodes. Any other phase change may be used without departing from the disclosure.

A single resulting signal $Rx_{F1, F2, F3}$ (332) may be obtained from one Rx electrode (232) for further processing. The resulting signal $Rx_{F1, F2, F3}$ (332) may include the effects of the non-sinusoidal transmitter signals (322) emitted at all sensing elements (225) associated with Tx electrodes that are driven with the non-sinusoidal transmitter signals having three different base frequencies and different phases. The resulting signal $Rx_{F1, F2, F3}$ (332) may further include the effect of the presence or absence of an input object at the sensing elements (225).

The charge integrator (342) receives the resulting signal $Rx_{F1, F2, F3}$ (332) and may integrate the resulting signal $Rx_{F1, F2, F3}$ (332) over an integration time interval. The ADC (344) receives the resulting signal $Rx_{F1, F2, F3}$ (332) after the integration and performs an analog-to-digital conversion.

The output of the ADC is provided to a set of digitally implemented demodulators (362). In one or more embodiments, the demodulators (362) are configured to generate the sensing signals (364). In one or more embodiments, the demodulators (362) include a demodulator for an in-phase (I) demodulation and a quadrature (Q) demodulation specific to each of the unique frequencies of the three non-sinusoidal transmitter signals (322). In other words, there may be six demodulators (three I demodulators and three Q demodulators) configured to perform three I/Q demodulations, as shown in FIG. 3. Each of the six demodulators may include a multiplier operation and a windowing operation, to generate the I and Q components of the sensing signals. The multiplier may multiply the input of the multiplier (i.e., the integrated, analog-to-digital converted resulting signal $Rx_{F1, F2, F3}$ (332) with a demodulation waveform to perform a demodulation. The windowing operation may provide a low pass filtering such as a weighted average of the mixer result (obtained from the multiplier operation). As further discussed below, the windowing operation may pass signals at the base frequency of the corresponding non-sinusoidal transmitter signal, while strongly attenuating at base frequencies of other (orthogonal) non-sinusoidal transmitter signals. The demodulation waveform may be based on the non-sinusoidal transmitter signals (322). For example, the demodulation waveform may be a sinusoidal waveform at the base frequency of the corresponding non-sinusoidal transmitter signal.

Accordingly, each of the demodulators performs a demodulation at the base frequency of the corresponding non-sinusoidal transmitter signal. In combination, the demodulators (362) perform a code division multiplexing (CDM) decoding at each of the three base frequencies to separate the sensing signals (364) associated with the three sensing elements (225). The demodulated I and Q components of the sensing signal associated with a sensing element may be combined to obtain an acceptably accurate sensing signal, even in presence of possible phase shifts.

Using the combined I and Q demodulations, a precise phase alignment between the integrated, analog-to-digital converted resulting signal $Rx_{F1, F2, F3}$ (332) and the demodulation waveform is not necessary to perform the demodulation. As a result, the ADC (344) may be relatively low-speed, for example, three to five times the speed of the base frequency of the non-sinusoidal transmitter signal frequency. This may result in the introduction of a phase offset which is, however, mitigated by the use of the combined I and Q demodulations. The use of a low-speed ADC reduces power consumption and cost, whereas the additional Q demodulator is associated with negligible additional cost and power consumption, because it is digitally implemented. Accordingly, the described configuration using a digital I/Q demodulation and an analog-to-digital conversion prior to the demodulation is cost effective and energy efficient. While a digital I/Q demodulation is described, an analog I/Q demodulation may be performed, followed by an analog-to-digital conversion, without departing from the disclosure.

In one embodiment, only I demodulators (no Q demodulators) are used to perform the demodulation. To obtain a reasonably precise phase alignment using only I demodulators, a faster ADC (344) may be used to reduce a possible phase offset. For example, the ADC may operate at at least 16 times the speed of the base frequency of the non-sinusoidal transmitter signal frequency.

As previously mentioned, one or more embodiments employ non-sinusoidal transmitter signals (322). In the example of FIG. 3, a single non-sinusoidal transmitter signal with a trapezoidal waveform may be used. Any other non-sinusoidal waveform, e.g., a square wave, may be used, without departing from the disclosure. In comparison to sinusoidal waveforms, non-sinusoidal waveforms may have various advantages. For example, it may be relatively easy to synthesize a non-sinusoidal waveform using basic circuit elements. It may further be relatively easy to generate non-sinusoidal waveforms with amplitudes higher than the system voltage. For example, a 9V amplitude may be achieved using a 3V system voltage. Also, a non-sinusoidal waveform may have a higher signal energy at the base frequency than a sinusoidal waveform with the same nominal amplitude. In FIG. 3, the trapezoidal waveform used as a non-sinusoidal transmitter signal (322) is shown in the time domain (left) and in the frequency domain (right). The trapezoidal waveform has a base frequency of 100 kHz and an amplitude of 1V. As the frequency spectrum shows, the amplitude at the base frequency is 1.254V (1.97 dB). Accordingly, at the base frequency, for the same voltage of the non-sinusoidal transmitter signal, a trapezoidal waveform has a higher signal energy, in comparison to a sinusoidal waveform thereby providing various potential advantages such as the ability to use a lower transmitter signal voltage, obtaining a higher signal to noise ratio when using the same voltage, etc. However, as FIG. 3 illustrates, non-sinusoidal waveforms such as trapezoidal waveforms also include harmonics different from the base frequency. In case of the trapezoidal waveform shown in FIG. 3, there is a $3^{rd}$ (300 kHz), $5^{th}$ (500 kHz), etc., harmonic. In the frequency spectrum shown in FIG. 3, the base frequency amplitude of the third harmonic is 10.6 dB lower than the base frequency, the base frequency amplitude of the fifth harmonic is 17.4 dB lower than the base frequency, etc. The total harmonic distortion for the first 10 harmonics is −9.6 dB.

Due to the presence of higher harmonics, in one or more embodiments, aliasing occurs at the ADC (344). The effects of the aliasing may be detrimental to the accuracy of the sensing signals (364). The effects are subsequently described based on the following scenario. Assume that the three base frequencies for the non-sinusoidal transmitter signals (322) are 100 kHz, 109.9 kHz, and 119.8 kHz. The base frequencies for a burst length of 200 µs are spaced 9.9 kHz apart, which results in orthogonality (or near-orthogonality) when performing a demodulation (discussed below) using a Hanning window. Other frequency spacings may be used for other types of windows, other burst lengths, etc. Further, assume that the ADC sampling frequency, Fs, of the ADC (344) is set to 500 kHz. At Fs=500 kHz, the Nyquist frequency is 250 kHz. Accordingly, aliasing occurs for the higher harmonics of all three non-sinusoidal transmitter signals (322). As a result of the aliasing, in one or more embodiments, the higher harmonics appear as aliasing artifacts at the output of the ADC (344) at lower frequencies.

The lower frequencies at which the aliasing artifacts appear may be determined using a combination of shift and fold operations. If a higher harmonic, as a result of the aliasing, appears as an aliasing artifact at or near one of the base frequencies of the non-sinusoidal transmitter signals, an erroneous sensing signal may result. In the above example, the $5^{th}$ harmonic of the non-sinusoidal transmitter signal at 119.8 kHz is 5×119.8 kHz=599 kHz. Performing the aliasing analysis using shift and fold operations, the $5^{th}$ harmonic appears as an aliasing artifact at 99 kHz when using a 500 kHz ADC sampling frequency. Because 99 kHz is close to the 100 kHz base frequency of one of the non-sinusoidal transmitter signals, the sensing signal obtained for demodulation performed at 100 kHz is inaccurate.

In one or more embodiments, the ADC sampling frequency, Fs, is selected to reduce the error caused by higher harmonics appearing as aliasing artifacts near the base frequencies. More specifically, Fs is adjusted such that no aliasing artifacts are in close proximity to any of the base frequencies. A desired Fs may be selected by systematically varying Fs while monitoring an inter-band interference (i.e., a presence of aliasing artifacts in proximity to the base frequencies). The desired Fs may be the Fs at which the inter-band interference is minimal. A description of the inter-band interference is subsequently provided in reference to the example shown in FIG. 4.

While FIG. 3 shows a particular processing configuration, other configurations may be used, without departing from the disclosure. For example, while FIG. 3 shows the simultaneous driving of three Tx electrodes using non-sinusoidal transmitter signals with three unique base frequencies, any number of Tx electrodes may be simultaneously driven with any number of non-sinusoidal transmitter signals. Further, while FIG. 3 shows a processing configuration for processing a single resulting signal obtained from three Rx electrodes, the analog and digital processing components as shown may be replicated to process additional resulting signals.

Figure 4:
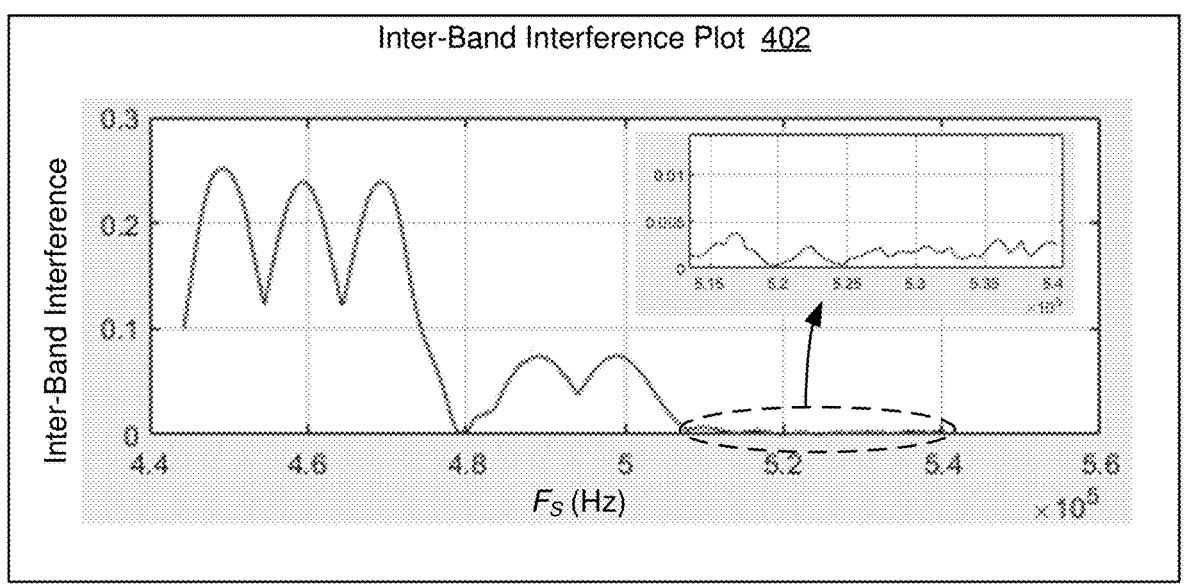
FIG. 4 shows an example of an inter-band interference analysis, in accordance with one or more embodiments.
Figure 4:
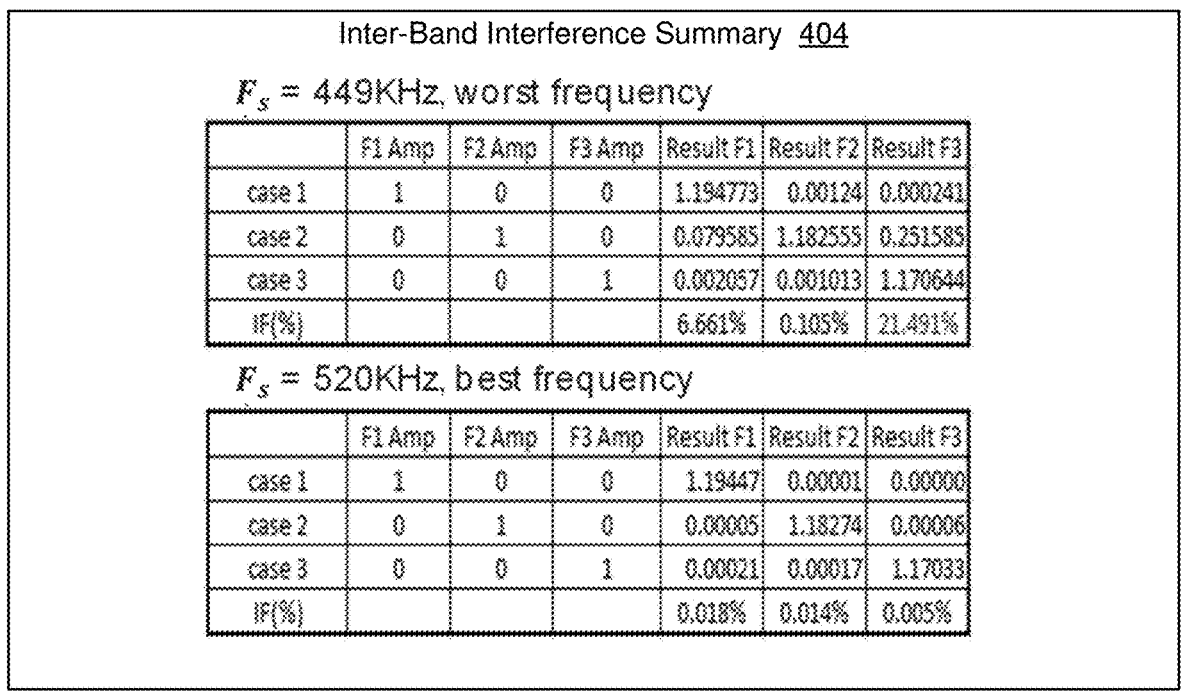

FIG. 4 shows an example of an inter-band interference analysis, in accordance with one or more embodiments. In the example, Fs is adjusted in a range of 500 kHz+/−10% to identify an Fs with an acceptably low inter-band interference. The range of frequencies that are analyzed is limited (to +/−10%, in the example) to reduce the possibility of interference caused by external noise (noise originating from sources different from the input device). External noise may originate from various components such as power supplies, display devices, etc. The external noise may be concentrated at particular frequencies, and the initial Fs (500 kHz) may be selected such that interference by the external noise is unlikely. Accordingly, a variation of Fs within a limited range reduces the likeliness of selecting a frequency where external noise causes significant interference.

As FIG. 4 illustrates in the inter-band interference plot (402), an inter-band interference is determined as Fs is adjusted in a frequency range from 450 kHz to 550 kHz. The inter-band interference is a quantity that indicates the interference caused by driving one or more Tx electrodes at a first frequency while digitally demodulating (after the A/D conversion and possible aliasing) at a second frequency. Referring to the previously introduced example that uses 100 kHz, 109.9 kHz, and 119.8 kHz for the non-sinusoidal transmitter signals, the following inter-band interference may occur due to aliasing:

(i) driving at 100 kHz and demodulating at 109.9 kHz;
(ii) driving at 100 kHz and demodulating at 119.8 kHz;
(iii) driving at 109.9 kHz and demodulating at 100 kHz;
(iv) driving at 109.9 kHz and demodulating at 119.8 kHz;
(v) driving at 119.8 kHz and demodulating at 100 kHz; and
(vi) driving at 119.8 kHz and demodulating at 109.9 kHz.

The inter-band interference for each of these six cases may be obtained across the frequency range. Accordingly, a plot (402) may be obtained for each of the six cases. Each plot may include frequencies at which the inter-band interference is unacceptably high, and may further include frequencies at which the inter-band interference is acceptably low or very low. As the plot (402) shows, given the specific scenario, the inter-band interference is particularly high for lower Fs, whereas the inter-band interference is lower to very low for higher Fs.

The inter-band interference summary (404) summarizes the results for the worst frequency (Fs=449 kHz) and the best frequency (Fs=520 kHz). The worst case interference is found to be 21.491% when the non-sinusoidal transmitter signal is emitted at F2 (109.9 kHz) while a demodulation is performed at F3 (119.8 kHz). This inter-band interference is prominently visible in plot (402) (leftmost peak). In contrast, for the best frequency, all interference remains below 0.02%. The almost complete absence of interference is visible in plot (402) (magnified frequency range).

An optimization may be performed to select an Fs at which the interference for all six cases is acceptable. A method for determining Fs is discussed below. While the example in FIG. 4 is for three non-sinusoidal transmitter signals, a similar analysis may be performed for any number of non-sinusoidal transmitter signals.

Figure 5:
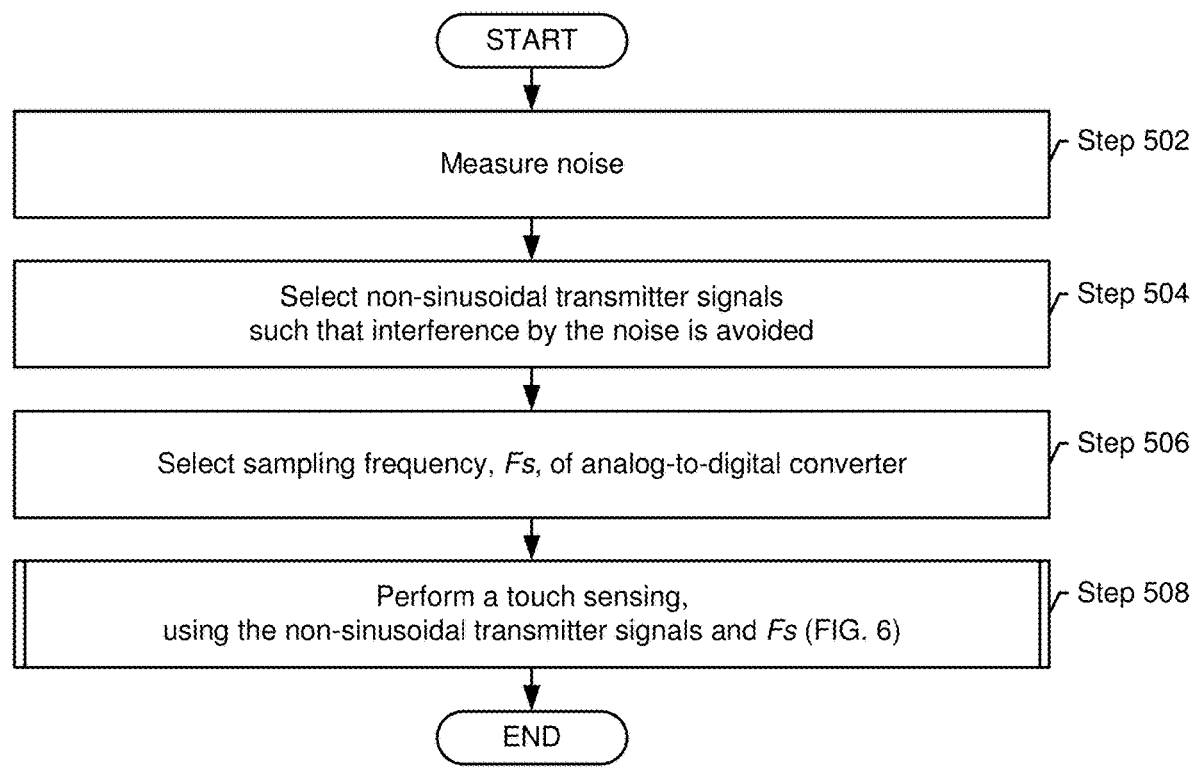
FIG. 5 shows a flowchart describing a method for inter-band harmonics interference mitigation for a multi-frequency-region parallel scan, in accordance with one or more embodiments.
Figure 6:
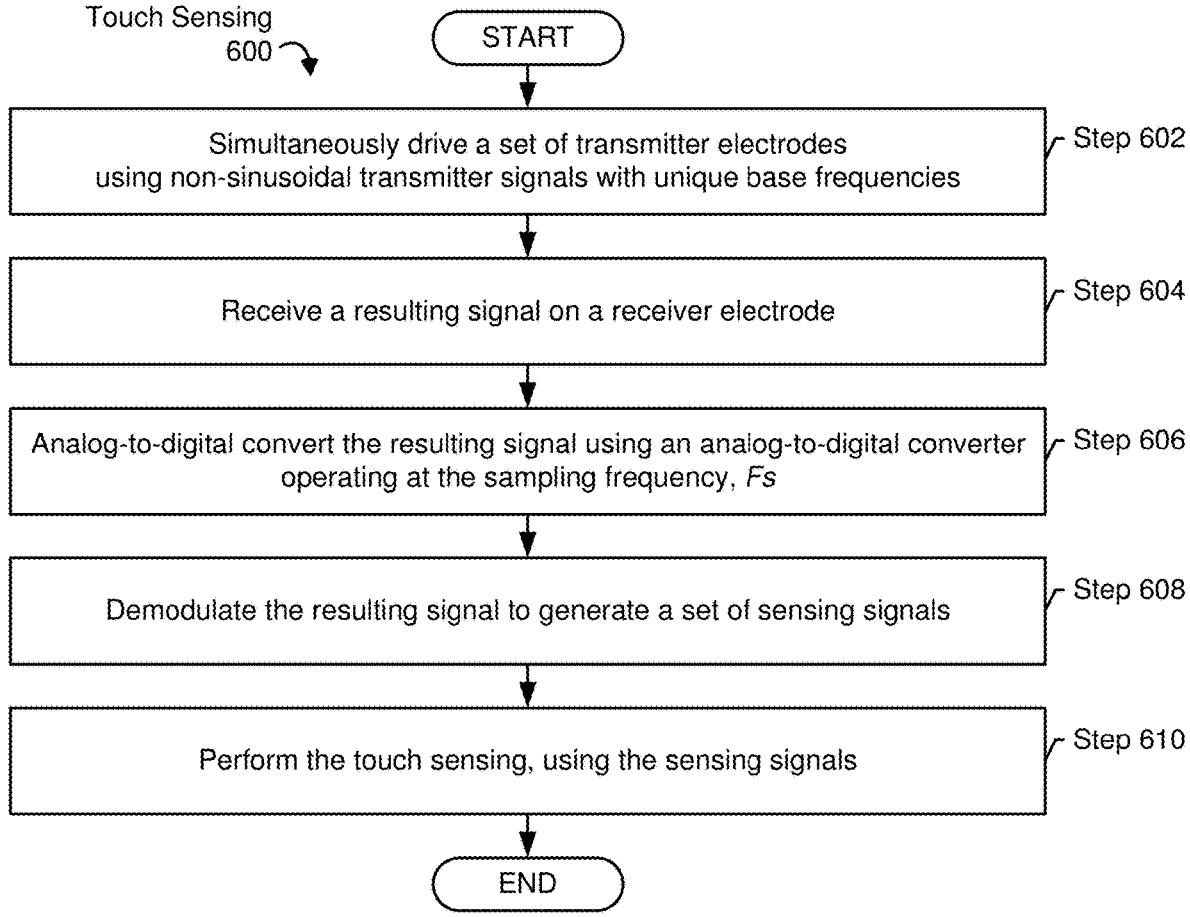
FIG. 6 shows a flowchart describing a method for multi-frequency-region touch sensing, in accordance with one or more embodiments.

FIG. 5 and FIG. 6 show flowcharts in accordance with one or more embodiments. One or more of the steps in FIG. 5 and FIG. 6 may be performed by the components discussed above in reference to FIG. 1, FIG. 2A, FIG. 2B, and FIG. 3. While the various steps in these flowcharts are presented and described sequentially, one of ordinary skill will appreciate that at least some of the steps may be executed in different orders, may be combined, or omitted, and some of the steps may be executed in parallel. Additional steps may further be performed. Accordingly, the scope of the disclosure should not be considered limited to the specific arrangement of steps shown in FIG. 5 and FIG. 6.

The flowchart of FIG. 5 depicts a method (500) for inter-band harmonics interference mitigation for multi-frequency-region parallel scans, in accordance with one or more embodiments.

In Step 502, a noise measurement is performed. The noise may be measured under realistic operating conditions, e.g., in presence of possible noise sources such as displays, power supplies, etc. The noise measurement may be used to distinguish noisy frequency regions from less noisy or noise-free frequency regions. A spectral analysis may be performed to make the distinction.

In Step 504, non-sinusoidal transmitter signals are selected such that interference by the noise, identified in Step 502 is avoided or at least reduced. In other words, a frequency region with relatively little noise present may be selected for the non-sinusoidal transmitter signals. Assume, for example, that noise is detected at 50 kHz, based on the execution of Step 502. To avoid the detected noise, the base frequencies of the non-sinusoidal transmitter signals may be placed in a region around 100 kHz. The frequency spacing of the base frequencies, burst length, shape of the non-sinusoidal transmitter signal, etc. may be selected such that certain orthogonality requirements and timing requirements are met, as previously discussed. Step 504 may be performed for any number of simultaneously emitted non-sinusoidal transmitter signals. While the flowchart shows the measurement of noise and the selection of the non-sinusoidal transmitter signals as separate steps, these steps may be combined. For example, a measurement may be performed with a selected set of non-sinusoidal transmitter signals. If, based on the measurement, too much noise is found to be present, a different set of non-sinusoidal transmitter signals may be selected. The switching to a different set of non-sinusoidal transmitter signals may continue until a set is identified, for which the noise is determined to be acceptable.

In Step 506, the sampling frequency, Fs, of the analog-to-digital converter (ADC) is selected. In one or more embodiments, Fs is selected such that the aliasing artifacts associated with the higher harmonics of the non-sinusoidal transmitter signals are located at frequencies different from the base frequencies of the non-sinusoidal transmitter signals. In other words, Fs is adjusted to reduce the amplitude of the aliasing artifacts at the base frequencies to reduce or eliminate inter-band harmonics interference. Additional details are provided in reference to FIG. 3. The selection of Fs may be performed starting from a default sampling frequency. An optimization may be performed within a limited range surrounding the default sampling frequency. The optimization may be performed to minimize aliasing artifacts at the base frequencies of the non-sinusoidal transmitter signals. Any criteria may be used to specify an acceptable level of aliasing, at the base frequencies. For example, an inter-band harmonics interference of 1/1000 may be set as a threshold. Step 506 may be performed for a single set of non-sinusoidal transmitter signals, or multiple sets of non-sinusoidal transmitter signals in different frequency ranges. The use of multiple sets of non-sinusoidal transmitter signals may enable the input device to operate in different frequency ranges, e.g., dependent on the noise environment. The operations of Step 506 may be performed by measuring the inter-band harmonics interference on an actual input device, or by simulation. If a simulation is used, different components of the input device may be approximated by simulation models. For example, the characteristics of a sensing element and the analog frontend may be approximated by first order (single pole) simulation models with time constants that approximate the characteristics of an actual sensing element and an actual analog frontend, respectively.

The operations of Steps 502-506 may be performed during the setup or manufacturing of the input device to program one or more sets of frequencies for the non-sinusoidal transmitter signals and a matching sampling frequency, Fs, into the input device. Alternatively, Steps 502-506 may be performed during operation of the input device.

In Step 508, a touch sensing may be performed. A description is provided below in reference to FIG. 6.

The flowchart of FIG. 6 depicts a method (600) for multi-frequency-region touch sensing, in accordance with one or more embodiments.

In Step 602, a set of Tx electrodes is simultaneously driven using multiple non-sinusoidal transmitter signals with unique base frequencies. Any number of Tx electrodes may be simultaneously driven. Additional details are provided in reference to FIG. 2A, FIG. 2B, and FIG. 3.

In Step 604, a resulting signal is obtained on an Rx electrode. Step 604 may be performed in parallel with Step 602. Further, Step 604 may be performed for multiple Rx electrodes simultaneously. The resulting signal received on an Rx electrode is affected by the multiple non-sinusoidal transmitter signals coupled onto the Rx electrode. The coupling occurs where the Rx electrode is in close spatial proximity to the Tx electrodes (e.g., at the sensing elements where the Tx electrodes intersect with the Rx electrode). The resulting signal is also affected by the presence or absence of an input object in proximity to the sensing elements because the capacitive coupling is affected by the presence or absence of the input object.

In Step 606, the resulting signal is analog-to-digital converted using an analog-to-digital converter operating at the sampling frequency, Fs, determined in Step 506.

In Step 608, the resulting signal, after the analog-to-digital conversion, is demodulated to generate a set of sensing signals. One sensing signal may be obtained for each of one or more Tx electrodes driven using a non-sinusoidal transmitter signal with a particular frequency. If both I demodulation and Q demodulation are performed, the resulting I and Q components of the sensing signal may be processed to determine an amplitude and/or phase of the sensing signal. Additional details are provided in reference to FIG. 2A, FIG. 2B, and FIG. 3. A solution for sensing signals specific to particular sensing elements may be obtained by solving for the sensing signals over the multiple bursts of the non-sinusoidal transmitter signal. For example, a unique solution may be obtained when 20 bursts are used for a configuration that includes 20 sensing elements. If Step 604 is performed for multiple Rx electrodes, then Step 608 may also be performed multiple times to demodulate each of the resulting signals associated with the multiple Rx electrodes.

The described steps may be repeated. For example, Steps 602-606 may be repeated while driving different sets of Tx electrodes selected from the Tx electrodes in the frequency regions, as previously described in reference to FIG. 2A, FIG. 2B, and FIG. 3. A capacitive image with sensing signals for a complete set of sensing elements of the capacitive image may be available after performing Steps 602-608 for all Tx electrodes in a sensing region.

In Step 610, a touch sensing may be performed, using the sensing signal. The touch sensing may involve evaluating the sensing signal against a previously determined baseline value. An input object may be considered to be present in proximity to the sensing element corresponding to the sensing signal if the sensing signal deviates from the baseline value by at least a certain amount. Step 610 may be performed for some or all sensing signals associated with the sensing elements of the capacitive image.

Steps 602-610 may be repeated, e.g., periodically, to perform a touch sensing over time.

Embodiments of the disclosure have various advantages. The use of simultaneously emitted transmitter signals with different frequencies enables the driving of large numbers of Tx electrodes (which may be necessary for larger touch screens) at a high frame rate without shortening the burst of the emitted transmitter signals. Embodiments of the disclosure use non-sinusoidal waveforms. Non-sinusoidal waveforms have the advantage that they are relatively easy to generate, even with amplitudes higher than the system voltage. Further, non-sinusoidal waveforms have a higher voltage amplitude at the base frequency than sinusoidal waveforms. The resulting higher signal energy at the base frequency provides various advantages such as the ability to use a lower transmitter signal voltage, obtaining a higher signal to noise ratio when using the same voltage, etc.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for operating an input device, the method comprising:
    obtaining a plurality of non-sinusoidal transmitter signals with unique base frequencies; and
    selecting a sampling frequency of an analog-to-digital converter (ADC) such that:
        a plurality of aliasing artifacts associated with higher harmonics of the non-sinusoidal transmitter signals are located at frequencies different from the base frequencies.

2. The method of claim 1, further comprising:
    simultaneously driving at least a subset of a plurality of transmitter electrodes using the plurality of non-sinusoidal transmitter signals;
    receiving, on a receiver electrode, a resulting signal,
        wherein the plurality of transmitter electrodes and the receiver electrode are disposed in a sensing region of the input device;
    analog-to-digital converting the resulting signal using the ADC operating at the sampling frequency;
    demodulating, using a plurality of demodulators, the resulting signal to generate a plurality of sensing signals,
        wherein each of the plurality of demodulators operates on a different frequency of the unique base frequencies; and
    performing a touch sensing, using the resulting signal.

3. The method of claim 1, wherein the non-sinusoidal transmitter signals of the plurality of non-sinusoidal transmitter signals are orthogonal to one another.

4. The method of claim 1, wherein the non-sinusoidal transmitter signals of the plurality of non-sinusoidal transmitter signals are based on one selected from the group consisting of trapezoidal waveforms and square waveforms.

5. The method of claim 1, wherein obtaining the plurality of non-sinusoidal transmitter signals comprises:
   measuring a noise; and
   selecting the plurality of non-sinusoidal transmitter signals to avoid interference by the noise.

6. The method of claim 1, wherein selecting the sampling frequency of the ADC comprises an adjustment of the sampling frequency to reduce an amplitude of the aliasing artifacts at the base frequencies.

7. The method of claim 6, wherein the adjustment of the sampling frequency is performed within a limited range surrounding a default sampling frequency.

8. The method of claim 6, wherein the adjustment of the sampling frequency is performed using a simulation model.

9. An input device, comprising:
   a plurality of transmitter electrodes disposed in a sensing region of the input device;
   a receiver electrode in the sensing region; and
   a processing system comprising:
      an analog-to-digital converter (ADC) operating at a sampling frequency,
   wherein the processing system is configured to:
      simultaneously drive at least a subset of the plurality of transmitter electrodes using a plurality of non-sinusoidal transmitter signals with unique base frequencies;
      receive, on the receiver electrode, a resulting signal; and
      analog-to-digital convert the resulting signal, causing a plurality of aliasing artifacts associated with higher harmonics of the plurality of non-sinusoidal transmitter signals,
         wherein the sampling frequency of the ADC is selected to locate the plurality of aliasing artifacts at frequencies different from the base frequencies.

10. The input device of claim 9,
   wherein the processing system further comprises a plurality of demodulators configured to demodulate the resulting signal to generate a plurality of sensing signals,
      wherein each of the plurality of demodulators operates on a different frequency of the unique base frequencies.

11. The input device of claim 9, wherein the non-sinusoidal transmitter signals of the plurality of non-sinusoidal transmitter signals are orthogonal to one another.

12. The input device of claim 9, wherein the non-sinusoidal transmitter signals of the plurality of non-sinusoidal transmitter signals are based on one selected from the group consisting of trapezoidal waveforms and square waveforms.

13. The input device of claim 9, wherein the sampling frequency of the ADC is selected by making an adjustment of the sampling frequency to minimize an amplitude of the aliasing artifacts at the base frequencies.

14. The input device of claim 13, wherein the adjustment of the sampling frequency is performed within a limited range surrounding a default sampling frequency.

15. A processing system for an input device,
   the processing system comprising:
      an analog-to-digital converter (ADC) operating at a sampling frequency,
   wherein the processing system is configured to:
      simultaneously drive at least a subset of a plurality of transmitter electrodes using a plurality of non-sinusoidal transmitter signals with unique base frequencies,
         wherein the plurality of transmitter electrodes is disposed in a sensing region of the input device;
      receive, on a receiver electrode, a resulting signal; and
      analog-to-digital convert the resulting signal, causing a plurality of aliasing artifacts associated with higher harmonics of the plurality of non-sinusoidal transmitter signals,
         wherein the sampling frequency of the ADC is selected to locate the plurality of aliasing artifacts at frequencies different from the base frequencies.

16. The processing system of claim 15, further comprising a plurality of demodulators configured to demodulate the resulting signal to generate a plurality of sensing signals,
   wherein each of the plurality of demodulators operates on a different frequency of the unique base frequencies.

17. The processing system of claim 15, wherein the non-sinusoidal transmitter signals of the plurality of non-sinusoidal transmitter signals are orthogonal to one another.

18. The processing system of claim 15, wherein the non-sinusoidal transmitter signals of the plurality of non-sinusoidal transmitter signals are based on one selected from the group consisting of trapezoidal waveforms and square waveforms.

19. The processing system of claim 15, wherein the sampling frequency of the ADC is selected by making an adjustment of the sampling frequency to minimize an amplitude of the aliasing artifacts at the base frequencies.

20. The processing system of claim 19, wherein the adjustment of the sampling frequency is performed within a limited range surrounding a default sampling frequency.

* * * * *